US007477541B2

(12) United States Patent
Abadeer et al.

(10) Patent No.: US 7,477,541 B2
(45) Date of Patent: Jan. 13, 2009

(54) MEMORY ELEMENTS AND METHODS OF USING THE SAME

(75) Inventors: Wagdi W. Abadeer, Jericho, VT (US); Anthony R. Bonaccio, Shelburne, VT (US); Jack A. Mandelman, Flat Rock, NC (US); William R. Tonti, Essex Junction, VT (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 240 days.

(21) Appl. No.: 11/353,493

(22) Filed: Feb. 14, 2006

(65) Prior Publication Data

US 2007/0189076 A1    Aug. 16, 2007

(51) Int. Cl.
*G11C 11/34* (2006.01)
(52) U.S. Cl. .................. 365/184; 365/182; 365/154
(58) Field of Classification Search .......... 365/184, 365/182, 177, 174, 154
See application file for complete search history.

(56) References Cited

U.S. PATENT DOCUMENTS

| 5,166,646 | A | 11/1992 | Avanic et al. |
| 5,220,194 | A | 6/1993 | Golio et al. |
| 6,061,267 | A * | 5/2000 | Houston ............... 365/154 |
| 6,198,652 | B1 | 3/2001 | Kawakubo et al. |
| 2002/0071305 | A1* | 6/2002 | Lu et al. ............... 365/154 |
| 2002/0140109 | A1 | 10/2002 | Keshavarzi et al. |
| 2003/0048655 | A1 | 3/2003 | El-Sharawy et al. |
| 2005/0111251 | A1* | 5/2005 | Liaw ..................... 365/154 |

OTHER PUBLICATIONS

Rino Choi et al., "Effects of drain to gate stress on NMOSFET with polysilicon/Hf-silicate gate stack", 2004, International SEMATECH—presentation visuals booklet, pp. HIK2-1-HIK2-10.
H. Rusty Harris et al., "Recovery of NBTI degradation in HfSiON/ Metal Gate Transistors", 2004, International SEMATECH—presentation visuals booklet, pp. HIK3-1-HIK2-10.
Jang H. (Johnny) Sim et al., "Hot carrier stress study in Hf-silciate NMOS transistors", 2004, International SEMATECH—presentation visuals booklet, pp. HIK4-1-HIK4-8.
G. Bersuker et al., "Mobility Evaluation in High-K Devices", 2004, International SEMATECH—presentation visuals booklet, pp. HIK5-1-HIK5-6.

* cited by examiner

*Primary Examiner*—Van Thu Nguyen
*Assistant Examiner*—Han Yang
(74) *Attorney, Agent, or Firm*—Roy W. Truelson (57) ABSTRACT

In a first aspect, a first apparatus is provided. The first apparatus is a memory element that includes (1) one or more MOSFETs each including a dielectric material having a dielectric constant of about 3.9 to about 25; and (2) control logic coupled to at least one of the one or more MOSFETs. The control logic is adapted to (a) cause the memory element to operate in a first mode to store data; and (b) cause the memory element to operate in a second mode to change a threshold voltage of at least one of the one or more MOSFETs from an original threshold voltage to a changed threshold voltage such that the changed threshold voltage affects data stored by the memory element when operated in the first mode. Numerous other aspects are provided.

11 Claims, 6 Drawing Sheets

MEMORY ELEMENTS AND METHODS OF USING THE SAME

FIELD OF THE INVENTION

The present invention relates generally to memory, and more particularly to memory elements and methods of using the same.

BACKGROUND

A conventional non-volatile storage element may be employed to store data. When such elements are coupled in parallel, a large voltage and/or current may be required to store data in the storage elements. Because power supply voltage have been and continue to be scaled to lower voltages, charge pumping or other elaborate circuitry is required to generate the large voltages and/or currents required for programming storage elements. The use of such high voltages and/or currents is also problematic within low voltage supply devices. In addition, conventional non-volatile memory elements require special processing levels. Consequently, an improved memory element and methods of using the same are desired.

SUMMARY OF THE INVENTION

In a first aspect of the invention, a first apparatus is provided. The first apparatus is a memory element that includes (1) one or more MOSFETs each including a dielectric material having a dielectric constant of about 3.9 to about 25; and (2) control logic coupled to at least one of the one or more MOSFETs. The control logic is adapted to (a) cause the memory element to operate in a first mode to store data; and (b) cause the memory element to operate in a second mode to change a threshold voltage of at least one of the one or more MOSFETs from an original threshold voltage to a changed threshold voltage such that the changed threshold voltage affects data stored by the memory element when operated in the first mode.

In a second aspect of the invention, a first method of storing data in a memory element is provided. The first method includes the steps of (1) providing a memory element, having (a) one or more MOSFETs each including a dielectric material having a dielectric constant of about 3.9 to about 25; and (b) control logic coupled to at least one of the one or more MOSFETs, wherein the control logic is adapted to cause the memory element to operate in a first mode to store data and cause the memory element to operate in a second mode to change a threshold voltage of at least one of the one or more MOSFETs from an original threshold voltage to a changed threshold voltage such that the changed threshold voltage affects data stored by the memory element when operated in the first mode; and (2) storing a first value in the memory element by operating the memory element in the first mode while a threshold voltage of at least one of the one or more MOSFETs is the original threshold voltage. Numerous other aspects are provided in accordance with these and other aspects of the invention.

Other features and aspects of the present invention will become more fully apparent from the following detailed description, the appended claims and the accompanying drawings.

DETAILED DESCRIPTION

The present invention provides an improved memory element and methods of using the same. The improved memory element may be a non-volatile memory element including at least a first transistor having a high-k dielectric (e.g., a dielectric material having a dielectric constant of about 3.9 to about 25) such as hafnium silicon oxide (HfSiO). A threshold voltage of the first transistor may be changed from a first value to a second value based on a first voltage applied to a gate terminal of the transistor. Further, the threshold voltage may be restored approximately to the first value based on a second voltage applied to the gate of the transistor.

A voltage of an output node of the memory element depends on the value of the threshold voltage of the first transistor. Accordingly, the memory element may be set to store at its output node (1) a first value by setting the threshold voltage of the first transistor to the first value; and (2) a second value by setting the threshold voltage of the first transistor to the second value.

The memory element may include logic adapted to operate the memory cell in a first mode (e.g., a functional mode) and a second mode (e.g., a programming mode). In the functional mode, the memory element stores a voltage at its output node based on the value of the threshold voltage of the first transistor. In the programming mode, the memory element allows the threshold voltage of the first transistor to be changed (e.g., between the first value and second value). In this manner, data stored by the memory element may be changed by changing a threshold voltage of the first transistor.

Additionally, the present invention may include methods and apparatus for storing data to a plurality of such improved memory elements connected in parallel. As will be described below, a current required to store such data may be reduced compared to that required to store data in a plurality of conventional non-volatile storage elements connected in parallel. For the plurality of memory elements, data may be stored and/or threshold voltages of transistors may be changed in parallel.

Figure 1:
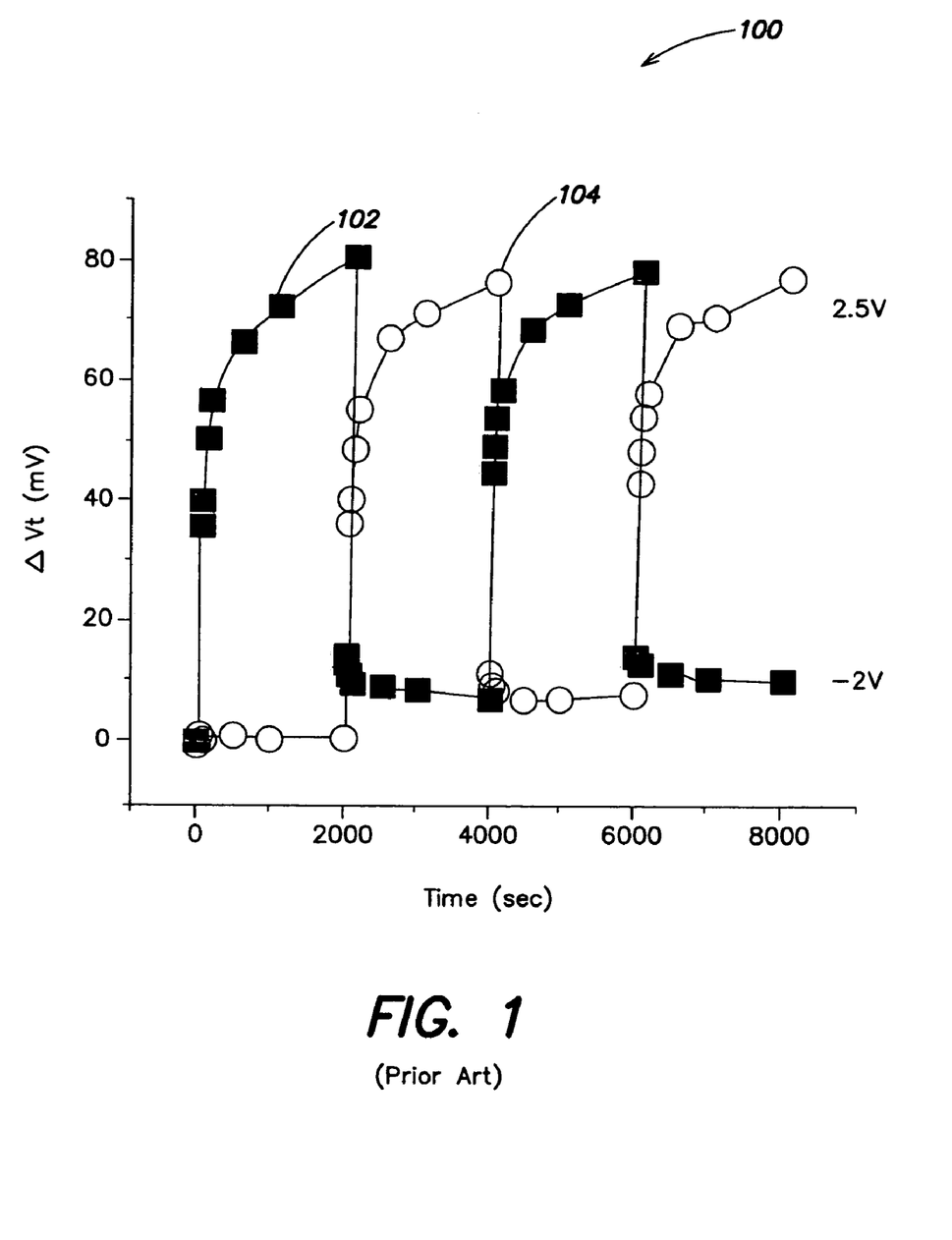
FIG. 1 is a graph illustrating the effect of a gate bias voltage on a threshold voltage over time of a MOSFET having an HfSiO dielectric.

FIG. 1 is a graph 100 illustrating the effect of a gate bias voltage on a threshold voltage (Vt) of a MOSFET having an HfSiO dielectric. The MOSFET may include such high-k dielectric material, processed with non-surface nitridation, having a thickness of about 4 nm on the substrate. Metalorganic chemical vapor deposition (MOCVD) or another suitable method may be employed to form the dielectric material on the MOSFET. HfSiO dielectric material has a high crystallization temperature and may be compatible with polysilicon material gates. With reference to FIG. 1, a first set 102 of data points (e.g., the squares) on the graph 100 illustrates changes in Vt of an HfSiO dielectric n-channel MOSFET (NMOS) caused by repeated application of a gate bias voltage of +2.5 V and −2.0 V to the NMOS at a temperature of 125° C. (e.g., with the gate bias voltage switching every 2000 seconds). Remaining terminals of the NMOS, such as the source, drain and body may be grounded. The gate bias voltage (e.g., stress) of +2.5 V may induce electron trapping during the stress. However, such stress produces no degradation in a sub-threshold voltage swing. Consequently, such stress does not cause a build up of interface state degradation. Therefore, the gate bias of +2.5 V may cause a parallel shift in Id-Vg characteristics of the HfSiO dielectric NMOS which indicates an increase in Vt from an original Vt to a changed Vt with a slight increase in transconductance ($g_m$) (e.g., maximum transconductance) from an original transconductance to a changed transconductance.

Thereafter, a gate bias voltage of −2.0 V may be applied to the NMOS. Following the positive gate bias stress with the −2.0V gate stress, may induce electron de-trapping during the stress. Consequently, the gate bias voltage of −2.0 V may cause the changed Vt and changed $g_m$ to return to approximately the original Vt and approximately the original $g_m$, respectively, without any degradation in sub-threshold voltage leakage slope. Therefore, the original Vt of the HfSiO dielectric NMOS may be restored (e.g., is recoverable).

A second set of data points 104 (e.g., the circles) on the graph 100 illustrates a change in Vt of an HfSiO dielectric n-channel MOSFET (NMOS) caused by repeated application of a gate bias voltage of +2.5 V and −2.0 V to the NMOS at a temperature of 125° C., 2000 seconds after the stress application of data points 102. The data shown is exemplary, and therefore, the effect of a gate bias voltage on a threshold voltage (Vt) of a MOSFET having an HfSiO dielectric may be different.

The graph 100 illustrates, for example, that stress cycles (e.g., positive stress or negative relaxation) of an HfSiO NMOS are identical and independent of starting point. The stress cycles are independent of the number of stress cycles performed previously. Further, the graph 100 indicates there may be a slight offset in an initial original threshold voltage and a reversed or restored threshold voltage (e.g., such Vts are not identical). Therefore, the restored threshold voltage is approximately the original threshold voltage. However, following this initial offset, there may be no change in the two memory states or threshold voltage values. The slight offset in the initial original threshold voltage and the restored (e.g., reversed) threshold voltage is attributed to a band dependence, and thus voltage dependence, caused by accessibility of defect traps during the relaxation cycle. Traps in different energy levels throughout the HfSiO bandgap may contribute to trapping in the two distinct cases or states.

Traps in the high-k dielectric (e.g., HfSiO) are at different energy levels throughout the high-k bandgap. These various trap energy levels contribute to trapping at the two distinct memory states. In this manner, trapping and de-trapping may occur in the high-k dielectric due to charge transfer with a substrate including the NMOS. In conventional floating-gate and SONOS (silicon-oxide-nitride-oxide-silicon) cells, trap levels exist in a single level. Further, use of conventional cells may result in interface state generation accompanied by degradation in sub-threshold voltage leakage slope. In contrast, the HfSiO dielectric of the present non-volatile memory element includes trap levels throughout the high-k dielectric. Further, there is no surface state build up or degradation in sub-threshold voltage leakage slope. Further, the HfSiO dielectric has very small temperature dependence with an activation energy of no more than about 0.042 eV. Thus, the two Vt states of the high-k dielectric NMOS are stable with respect to temperature.

Figure 2:
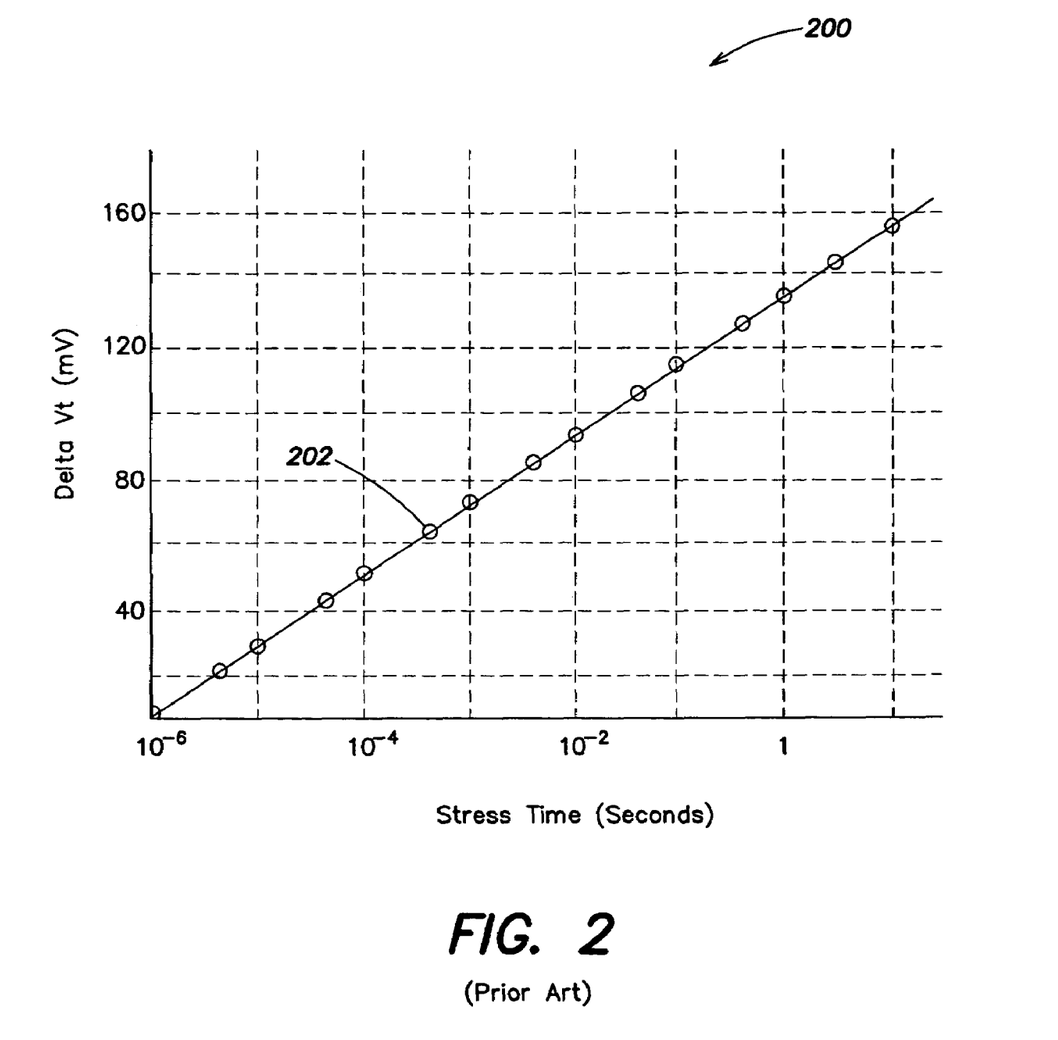
FIG. 2 is a graph illustrating a change in Vt of an HfSiO dielectric MOSFET over time as a gate bias of +2.5 V is applied to the MOSFET.

FIG. 2 is a graph 200 illustrating a change in Vt of an HfSiO dielectric MOSFET over time as a gate bias of +2.5 V is applied to the MOSFET. With reference to FIG. 2, a set 202 of data points on the graph 200 illustrates a change in Vt of an HfSiO dielectric n-channel MOSFET (NMOS) caused by application of a gate bias voltage of +2.5 V over time. As shown, after applying the gate bias voltage (e.g., stress) to the NMOS for about 100 µs, the Vt may shift approximately 50 mV. Similarly, after applying the gate bias voltage (e.g., stress) to the NMOS for about 20 ms, the Vt may shift approximately 100 mV. The data shown is exemplary, and therefore, the effect of a gate bias voltage of +2.5 V on Vt of the HfSiO dielectric NMOS may be different. Measured ΔVts are stable without any voltage applied to the gate. Further, an original Vt may be restored (e.g., is recoverable) by application of an appropriate gate bias voltage (Vg) (e.g., a negative Vg) for an appropriate amount of time.

Figure 3:
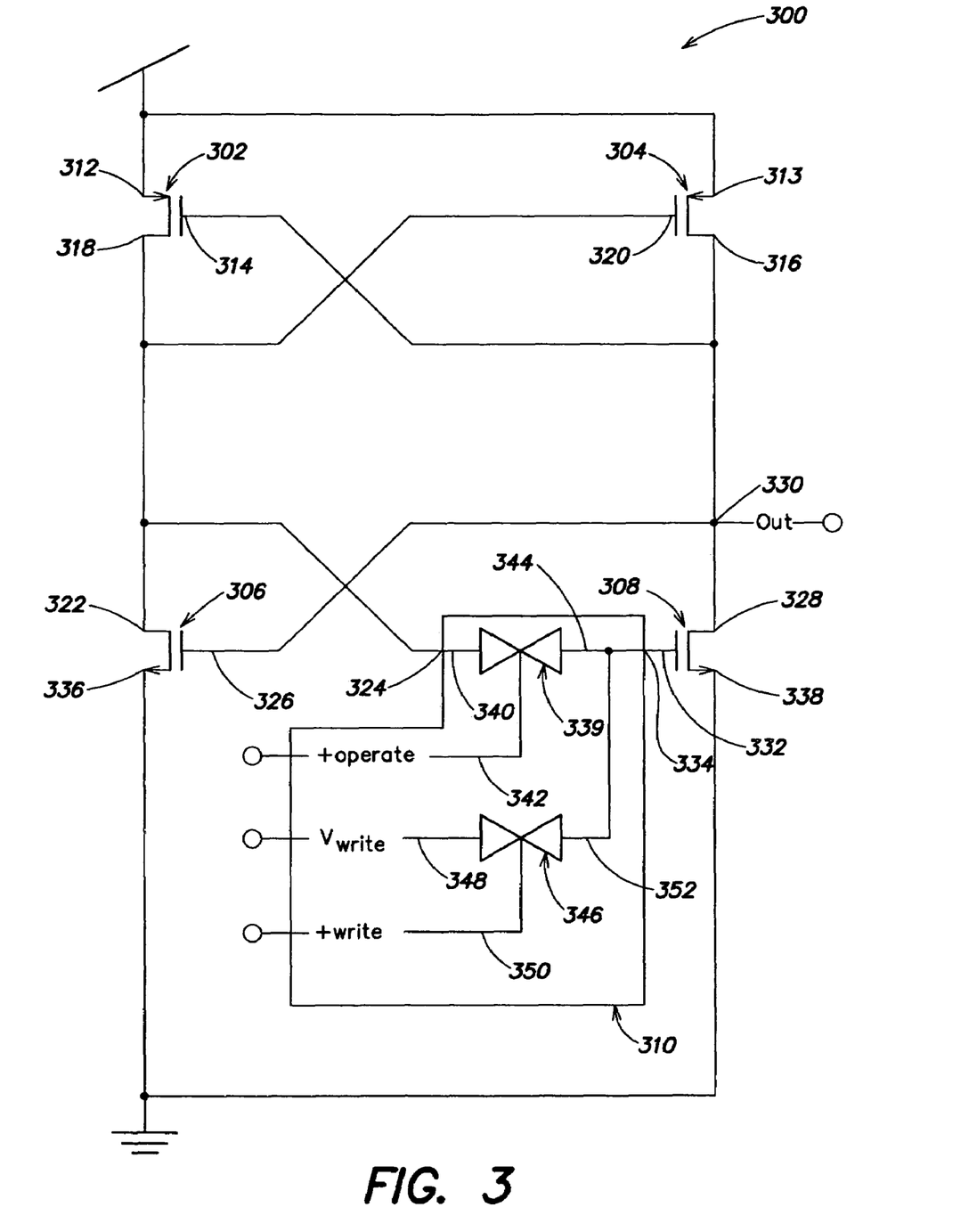
FIG. 3 is a first exemplary memory element in accordance with an embodiment of the present invention.

FIG. 3 is a first exemplary memory element in accordance with an embodiment of the present invention. With reference to FIG. 3, the memory element 300 may include a plurality of MOSFETs, one or more of which are high-k (e.g., HfSiO) dielectric MOSFETs. For example, the memory element 300 may include a first and second PMOS 302, 304 coupled to a first and second NMOS 306, 308. At least the first and second NMOSs 306, 308 include high-k (e.g., HfSiO) dielectric material which provides the advantages described above. Further, the memory element 300 may include control logic 310 coupled to the plurality of MOSFETs. The control logic 310 may be adapted to operate the memory element 300 in a plurality of modes. For example, the control logic 310 may be adapted to cause the memory element 300 to operate in at least a first and a second mode. The first mode may be a functional mode in which the memory element 300 may store data (e.g., a bit) such as a logic "0" or a logic "1". The second mode may be a programming mode in which a threshold voltage (Vt) of one or more of the plurality of MOSFETs 302-308 may be changed.

In one embodiment, a source 312 of the first PMOS 302 and a source 313 of the second PMOS 304 may be coupled to a high power supply (e.g., $V_{DD}$ or the like). A gate 314 of the first PMOS 302 may be coupled to a drain 316 of the second PMOS 304. Further, a drain 318 of the first PMOS 302 may be coupled to each of a gate 320 of the second PMOS 304, a drain 322 of the first NMOS 306, and a first input 324 of the control logic 310.

Similarly, the drain 316 of the second PMOS 304 and the gate 314 of the first PMOS 302 may be coupled to a gate 326 of the first NMOS 306 and a drain 328 of the second NMOS 308. All of these terminals may be coupled to a node 330 to facilitate the connections. Such node 330 may serve as an output out of the memory element 300. A gate 332 of the second NMOS 308 may be coupled to an output 334 of the control logic 310. Further, a source 336 of the first NMOS 306 and a source 338 of the second NMOS 308 may couple a low power supply such as ground.

The control logic 310 may include a plurality of pass-gates. For example, the control logic 310 may include a first pass-gate (e.g., a high-voltage pass-gate) 339 with a first input 340 which serves as the first input 324 of the control logic 310. A second input 342 (e.g., a control input) of the control logic 310 may serve as a second input of the first pass-gate 339. An output 344 of the first pass-gate 339 may serve as an output 334 of the control logic 310. Further, the control logic 310 may include a second pass-gate (e.g., a high-voltage pass-gate) 346. A third input 348 of the control logic 310 may serve as a first input of the second pass-gate 346. A fourth input 350 of the control logic 310 may serve as a second input (e.g., a control input) of the second pass-gate 346. An output 352 of the second pass-gate 346 may also be connected to the output 334 of the control logic 310. Therefore, the control logic 310 may serve as a high-voltage multiplexer by selectively outputting a signal based on one or more control signals. Such output signals may be used to modify a Vt of at least one MOSFET (e.g., the second NMOS 308) in the memory element 300 by applying a bias voltage to the gate of such a MOSFET 308 having a high-k dielectric.

The first and second NMOSs 306, 308 may be sized such that a channel width-to-length ratio (W/L) of the second NMOS 308 may be larger than the W/L of the first NMOS 306. For example, W/L of the second NMOS=β×W/L of the first NMOS, where β is a factor or constant. β may be in the range of about 2 to about 4 but its precise value may depend on a threshold voltage shift achievable in second NMOS 308. However, the first and second NMOSs 306, 308 may be sized differently. More specifically, a larger or smaller value may be employed for β. In this manner, respective threshold voltages of the first and second NMOSs 306, 308 may be approximately equal (e.g., within normal FET threshold matching parameters).

To operate the memory element 300 in the first mode (e.g., a functional mode), a signal +operate may be asserted on the control input 342 of the first pass-gate 339. When such signal is asserted on the control input 342, the control logic 310 enables the first pass-gate 339 to output a signal received from the drain 318 of the first PMOS 302 to the gate 332 of the second NMOS 308. For example, during a first time period, the control logic 310 may cause the memory element 300 to operate in the first mode by asserting a signal to operate on the second input 342. When the memory element 300 operates in the first mode, the threshold voltage (Vt) of the second NMOS 308 may be the original threshold voltage. The memory element 300 may store data therein based on the original Vt. When operating in the first mode, a signal may not be asserted on the control input 350 of the second pass-gate 346.

During a second time period, to cause the memory element 300 to operate in the second mode (e.g., a programming mode), the control logic 310 may assert a signal +write on the control input 350 of second pass-gate 346. Also, the control logic 310 may cause a signal $V_{write}$ to be asserted on the first input 348 of the second pass-gate 346. When signal +write is asserted on the control input 350, the control logic 310 enables the second pass-gate 346 to output $V_{write}$ to the gate 332 of the second NMOS 308. During the second time period, $V_{write}$ may be about +2.5 V (although a larger or smaller value may be employed). In some embodiments, the control logic 310 may include and/or be coupled to charge pump circuitry adapted to boost a low-voltage signal received as input to a desired level (e.g., $V_{write}$ may be generated by charge pump circuitry). The boosted signal may be provided to a pass-gate. In such embodiments, the low-voltage signal may be about 1.0 V. As stated, the second NMOS 308 includes a high-k (e.g., HfSiO) dielectric. Consequently, when the gate 332 of the second NMOS 308 is biased by $V_{write}$, the threshold voltage of the second NMOS 308 may change from the original Vt to a changed Vt. For example, the original Vt may increase to the changed Vt. The original Vt may be about 300 mV and the changed Vt maybe about 350 mV (although a larger or smaller and/or different value may be employed for the original Vt and/or the changed Vt). By increasing Vt of the second NMOS 308 in this manner, the second NMOS 308 becomes weaker than the first NMOS 306. Therefore, when the memory element 300 is subsequently-operated in the first mode (e.g., during a third time period), data previously stored by the memory element 300 may be erased (e.g., overwritten by new data). For example, the memory element 300 may store a logic "0" during the first time period and the original Vt of the second NMOS 308 is changed to the changed Vt (e.g., during the second time period). When the memory element 300 is subsequently operated in the first mode (e.g., during a third time period), the first NMOS 306 is stronger than the second NMOS 308. To wit, Vt of the first NMOS 306 is less than Vt of the second NMOS 308. Consequently, the first NMOS 306 may turn on and cause the output of the memory element 300 to switch state (e.g., to a logic "1"). In this manner, the memory element 300 may erase (e.g., overwrite) previously-stored data. It should be noted that because the programming signal (e.g., $V_{write}$) may be applied directly to the insulating high-k dielectric gate of the second MOSFET 308, a small amount of current may change the state of the MOSFET.

In this manner, a memory element 300, such as a latch, initially may be designed using two cross-coupled devices (e.g., high-k dielectric NMOSs 306, 308) having different (e.g., imbalanced) W/L ratios. In this manner, the device with the larger W/L ratio (e.g., the second NMOS 308) is initially stronger than the other device (e.g., the first NMOS 306) in the cross-couple. When the memory element 300 operates in the first mode, a functional or operational mode, the first and second NMOSs 306, 308 are cross-coupled. Therefore, the stronger NMOS (e.g., the second NMOS 308) will overcome the other NMOS (e.g., the first NMOS 306) and cross-coupled PMOSs 302, 304 and cause the value stored by the memory element 300 to change (e.g., by pulling the output 330 of the memory element 300 low).

The memory element 300 may be programmed in the second mode. As described above, a writing voltage (e.g., $V_{write}$) may be applied (e.g., via the control logic 310) to the gate 332 of the second NMOS 308, which is initially the stronger NMOS. The writing voltage may cause Vt of the second NMOS 308 to change, thereby weakening the second NMOS 308. More specifically, Vt of the second NMOS 308 is increased, and therefore, the second NMOS 308 is weakened such that data stored by the memory element 300 will take on an opposite state when the memory element 300 is subsequently-operated in the first mode. An exemplary time required to program the memory element 300 (e.g., to change a Vt of the second NMOS 308 by applying a gate bias voltage thereto) is described above with reference to FIG. 2. Such programming time (along with low-voltage input signals that may be applied by the control logic 310) makes the non-volatile memory element 300 useful for low-cost portable applications which require that the state of a machine (e.g., including the memory element 300) be preserved when powered down. Further, a Vt of a high-k dielectric NMOS 308 of the memory element 300 is recoverable. More specifically, a first changed Vt may be changed to a second changed Vt, which is approximately an original Vt and thereby restored. Therefore, such an NMOS may have a sense and a hold state. Consequently, such an NMOS 308 may be employed in a non-volatile memory design.

More specifically, in some embodiments, another signal (e.g., of a negative voltage) may be asserted on the first input 348 of the second pass-gate 346 while the memory element 300 operates in the second mode. In this manner, the Vt of the first NMOS 308 may be changed from the changed Vt to approximately the original Vt. Thereafter, when the memory element 300 is operated in the first mode, the second NMOS 308 is stronger than the first NMOS 306. Consequently, the second NMOS 308 may turn on and cause the output of the memory element 300 to switch state. In this manner, the memory element 300 may erase (e.g., overwrite) previously-stored data. In such embodiments, the second pass-gate 346 may include a transistor (e.g., MOSFET) having a triple well or silicon-on-insulator design such that a body region-to-diffusion region forward bias does not occur when the negative bias voltage is applied to the transistor. Further, the transistor may include a thick oxide layer.

Figure 4:
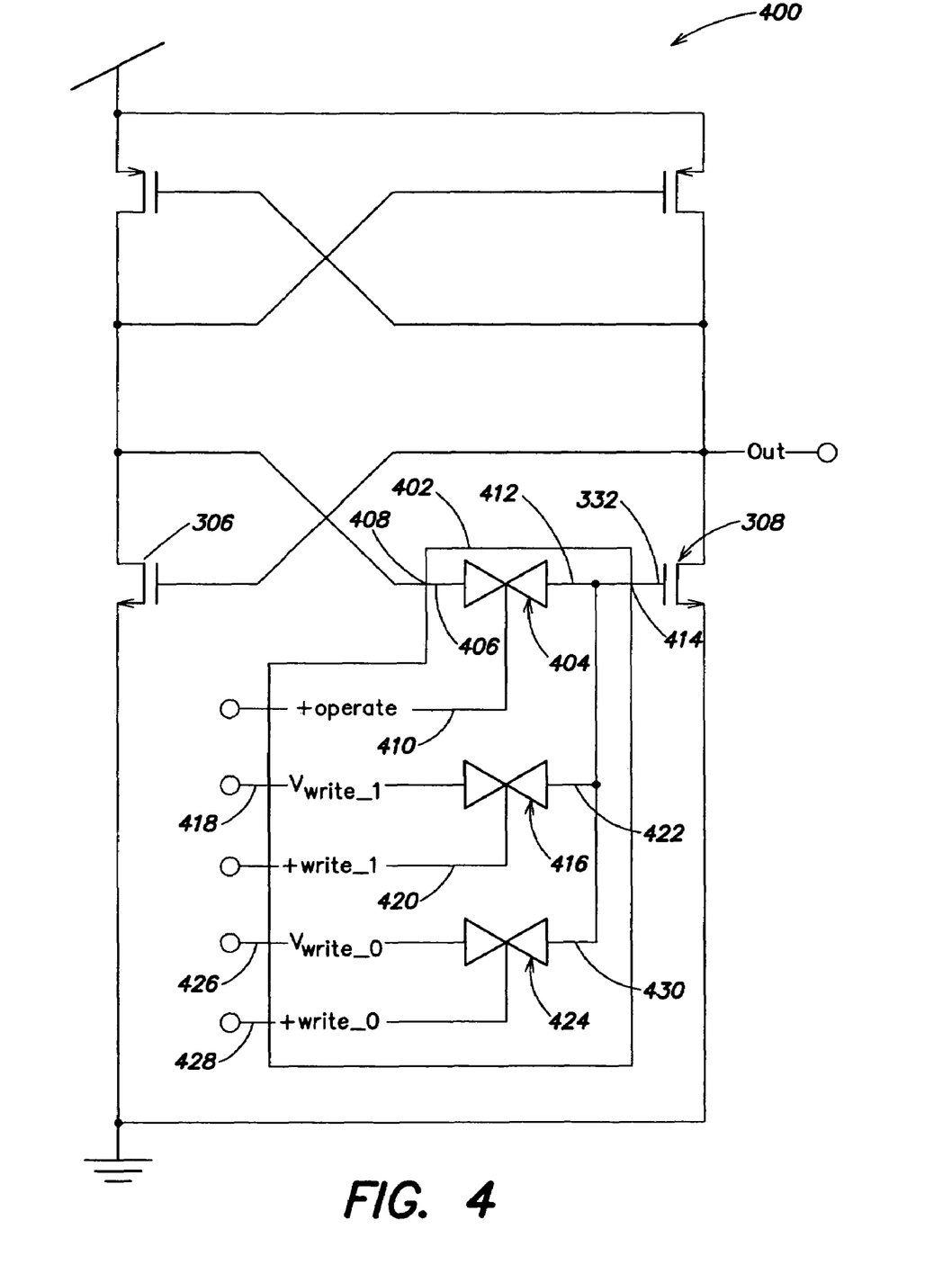
FIG. 4 is a second exemplary memory element in accordance with an embodiment of the present invention.

Alternatively, in some embodiments, memory element control logic may be configured differently. For example, FIG. 4 is a second exemplary memory element 400 in accordance with an embodiment of the present invention. With reference to FIG. 4, the second exemplary memory element 400 may be similar to the first exemplary memory element 300. In contrast, control logic 402 of the second exemplary memory element 400 may include different terminals or inputs on which a signal adapted to change the original threshold voltage of at least one of the plurality of MOSFETS (e.g., the second NMOS 308) and a signal adapted to approximately restore the original threshold voltage, respectively, are received. More specifically, the control logic 402 may include a plurality of pass-gates. For example, the control logic 402 may include a first pass-gate (e.g., a high-voltage pass-gate) 404 a first input 406 of which serves as the first input 408 of the control logic 402. A second input 410 (e.g., a control input) of the control logic 402 may serve as a second input of the first pass-gate 404. An output 412 of the first pass-gate 402 may serve as an output 414 of the control logic 402.

Further, the control logic 402 may include a second pass-gate (e.g., a high-voltage pass-gate) 416. A third input 418 of the control logic 402 may serve as a first input of the second pass-gate 416. A fourth input 420 of the control logic 402 may serve as a second input (e.g., a control input) of the second pass-gate 416. An output 422 of the second pass-gate 416 may serve as an output 414 of the control logic 402. For example, while the memory element 400 operates in the second mode, a signal $V_{write\_1}$ may be asserted on the third input 418. When signal +write_1 is asserted on the control input 420, the control logic 402 enables the second pass-gate 416 to output $V_{write\_1}$ to the gate 332 of the second NMOS 308. $V_{write\_1}$ may be about +2.5 V (although a larger or smaller value may be employed). In some embodiments, the control logic 402 may include and/or be coupled to charge pump circuitry adapted to boost a low-voltage signal received as input to a desired level (e.g. $V_{write\_1}$). In such embodiments, the low-voltage signal may be about 1.0 V. As stated, the second NMOS 308 includes a high-k (e.g., HfSiO) dielectric. Consequently, when the gate 332 of the second NMOS 308 is biased by $V_{write\_1}$, the threshold voltage of the second NMOS 308 may change from the original Vt to a changed Vt (e.g., a first changed Vt). For example, the original Vt may increase to the changed Vt. By increasing Vt of the second NMOS 308 in this manner, the second NMOS 308 becomes weaker than the first NMOS 306. Therefore, when the memory element 402 subsequently operates in the first mode, data stored by the memory element 400 may change (e.g., from a logic "0" to a logic "1").

Further, the control logic 402 may include a third pass-gate (e.g., a high-voltage pass-gate) 424. A fifth input 426 of the control logic 402 may serve as a first input of the third pass-gate 424. A sixth input 428 of the control logic 402 may serve as a second input (e.g., a control input) of the third pass-gate 424. An output 430 of the third pass-gate 424 may serve as an output 414 of the control logic 402. For example, while memory element 400 operates in the second mode, a signal $V_{write\_0}$ may be asserted on the fifth input 426. When signal +write_0 is asserted on the control input 428, the control logic 402 enables the third pass-gate 424 to output $V_{write\_0}$ to the gate 332 of the second NMOS 308. $V_{write\_0}$ may be about −2.0 V (although a larger or smaller value may be employed). As stated in some embodiments, the control logic 402 may include and/or be coupled to a charge pump circuitry adapted to boost a low-voltage signal received as input to a desired level (e.g., $V_{write\_0}$) In such embodiments, the low-voltage signal may be about 1.0 V.

As stated, the second NMOS 308 includes a high-k (e.g., HfSiO) dielectric. Consequently, assuming Vt of the second NMOS 308 was previously changed to a changed Vt (e.g., the first changed Vt), when the gate 332 of the second NMOS 308 is biased by $V_{write\_0}$, the threshold voltage of the second NMOS 308 may change from the first changed Vt to a second changed Vt, which is approximately the original Vt. By decreasing Vt of the second NMOS 308 in this manner, the second NMOS 308 becomes stronger than the first NMOS 306. Therefore, when the memory element 402 subsequently operates in the first mode, data stored by the memory element 400 may change (e.g., from a logic "1" to a logic "0").

In this manner, the memory cell 400 may be written with either a logic "0" or "1" more than once by applying a programming (e.g., write) voltage with an appropriate sign to change Vt of the second NMOS 308 as desired. For example, a positive programming voltage (e.g., $V_{write\_1}$) may be employed to shift Vt up, and a negative programming voltage (e.g., $V_{write\_0}$) may be employed to shift Vt down). In this manner, the memory element 300 may erase (e.g., overwrite) previously-stored data. It should be noted that because the programming signal (e.g., $V_{write\_1}$ and $V_{write\_0}$) may be applied directly to the insulating high-k dielectric gate of the second MOSFET 308, a small current may change the state of the MOSFET as desired.

Because the third pass-gate 424 may receive a negative signal, the third pass-gate 424 may be designed to accommodate large and possibly negative potentials. For example, the third pass-gate 424 may include a transistor (e.g., MOSFET) having a triple well or silicon-on-insulator design such that a body region-to-diffusion region forward bias does not occur when the negative bias voltage is applied to the transistor. Further, the transistor may include a thick oxide layer.

In this manner, the control logic 402 may serve as a high-voltage multiplexer by selectively outputting a signal based on a control signal. Such an output signal may be used to modify a Vt of at least one MOSFET (e.g., the second NMOS 308) in the memory element 400. More specifically, the control logic 402 may receive, via the third input 418, and selectively output a first signal $V_{write\_1}$ adapted to change the Vt of the second NMOS 308 from an original Vt to a changed Vt (e.g., the first changed Vt). Further, the control logic 402 may receive, via a fifth input 426, and selectively output a second signal $V_{write\_0}$ adapted to change the Vt of the second NMOS 308 from the changed Vt (e.g., the first changed Vt) to a second changed Vt (e.g., approximately the original Vt). Consequently, $V_{write\_0}$ may approximately restore the original Vt of the second NMOS 308. In this manner, the memory element 400 may store data therein and erase data therefrom.

Figure 5:
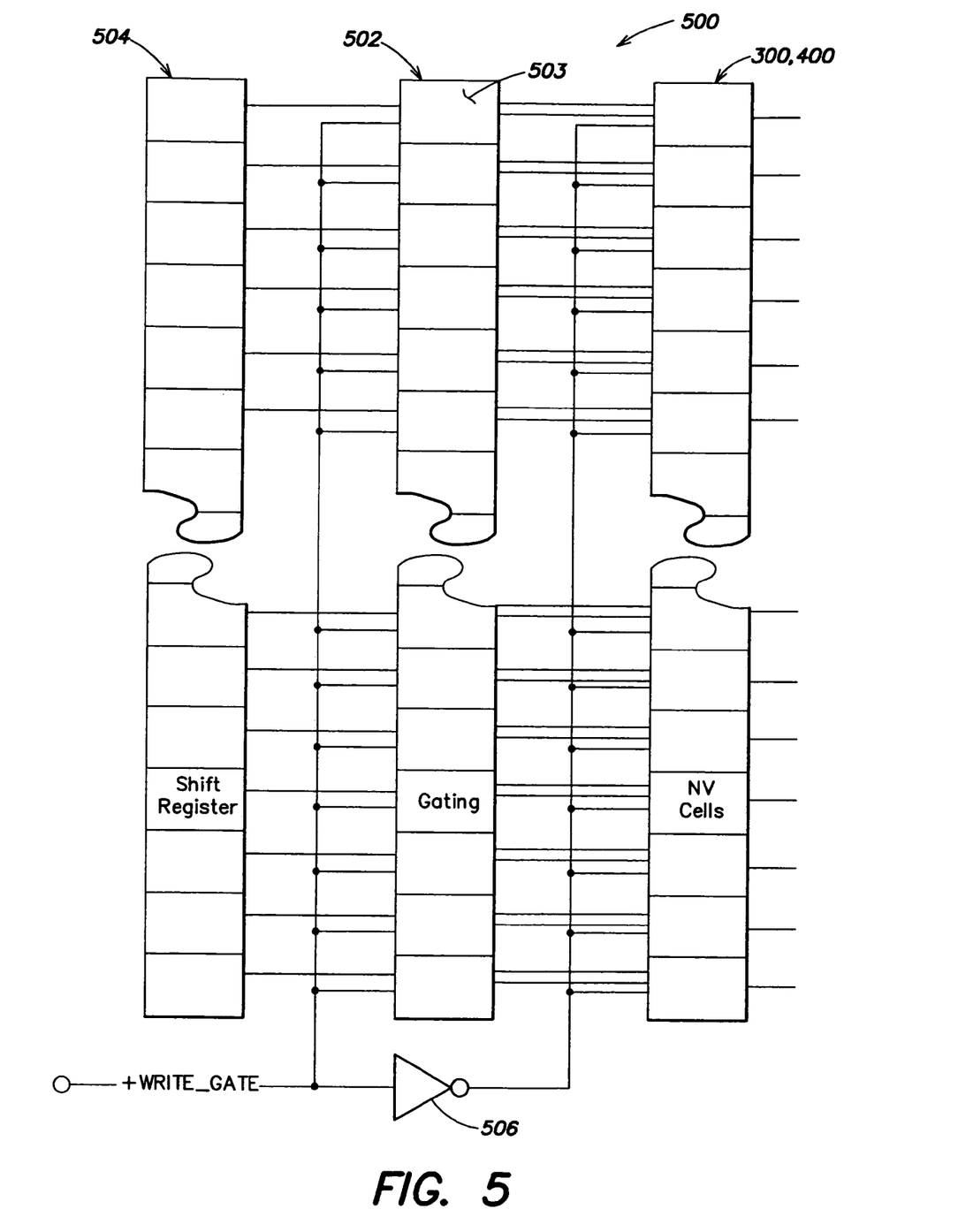
FIG. 5 is a first exemplary memory system in accordance with an embodiment of the present invention.

FIG. 5 is a first exemplary memory system in accordance with an embodiment of the present invention. With reference to FIG. 5, the memory system 500 may include gating logic 502 coupled to a plurality of the non-volatile memory elements 300, 400. Additionally, the memory system 500 may include and/or be coupled to at least one shift register 504. The memory system 500 may be adapted to store data in the plurality of memory elements 300, 400 in parallel. To store data bits into respective memory elements 300, 400 in parallel, a string of such data bits may be scanned into the shift register 504. Further, the system 500 may know the location map of memory elements 300, 400 to be programmed. Therefore, a serial string of programming bits may be scanned into the shift register 504. Such data may be output from the shift register 504 to the plurality of memory elements 300, 400 in parallel.

Gating logic 502 may include a plurality of gating cells 503 each of which may be adapted to output corresponding data to a memory element 300, 400. Further, each gating cell may be adapted to calculate one or more programming voltages (e.g., $V_{write\_1}$, $V_{write\_0}$ and or the like) to be applied to the memory element 300, 400 (e.g., based on the programming bits). The gating logic 502 may gate the outputs of the shift register 504 based on a signal +WRITE_GATE. When +WRITE_GATE is asserted each gating cell of the gating logic 502 may provide data output from the shift register 504 to a corresponding memory element 300, 400. Further, when +WRITE_GATE is asserted each gating cell may calculate appropriate signal values for one or more programming voltages to be applied to the corresponding memory element 300, 400. The programming voltages may be calculated based on programming bits output from the shift register 504.

The signal +operate applied to the second input 342, 410 of the control logic 310, 402 of each memory element 300, 400 may be based on +WRITE_GATE. The signal +operate may be the complement of +WRITE_GATE. For example, the gating logic 502 may include and/or be coupled to a logic gate such as an inverter 506 adapted to receive +WRITE_GATE as input and output +operate therefrom.

In this manner, the memory system 500 may store the data bits output from the shift register 504 in the plurality of memory elements 300, 400 in parallel and/or apply corresponding programming voltages to the memory elements 300, 400 in parallel as desired. As stated above, a small amount of current may change the state of one or more high-k (e.g., HfSiO) dielectric MOSFETs of each non-volatile memory element 300, 400. Therefore, a plurality (e.g., large number) of such non-volatile memory elements 300, 400 may be programmed in parallel. The gating logic 502 described is exemplary, and therefore, gating logic having a different configuration may be employed.

Figure 6:
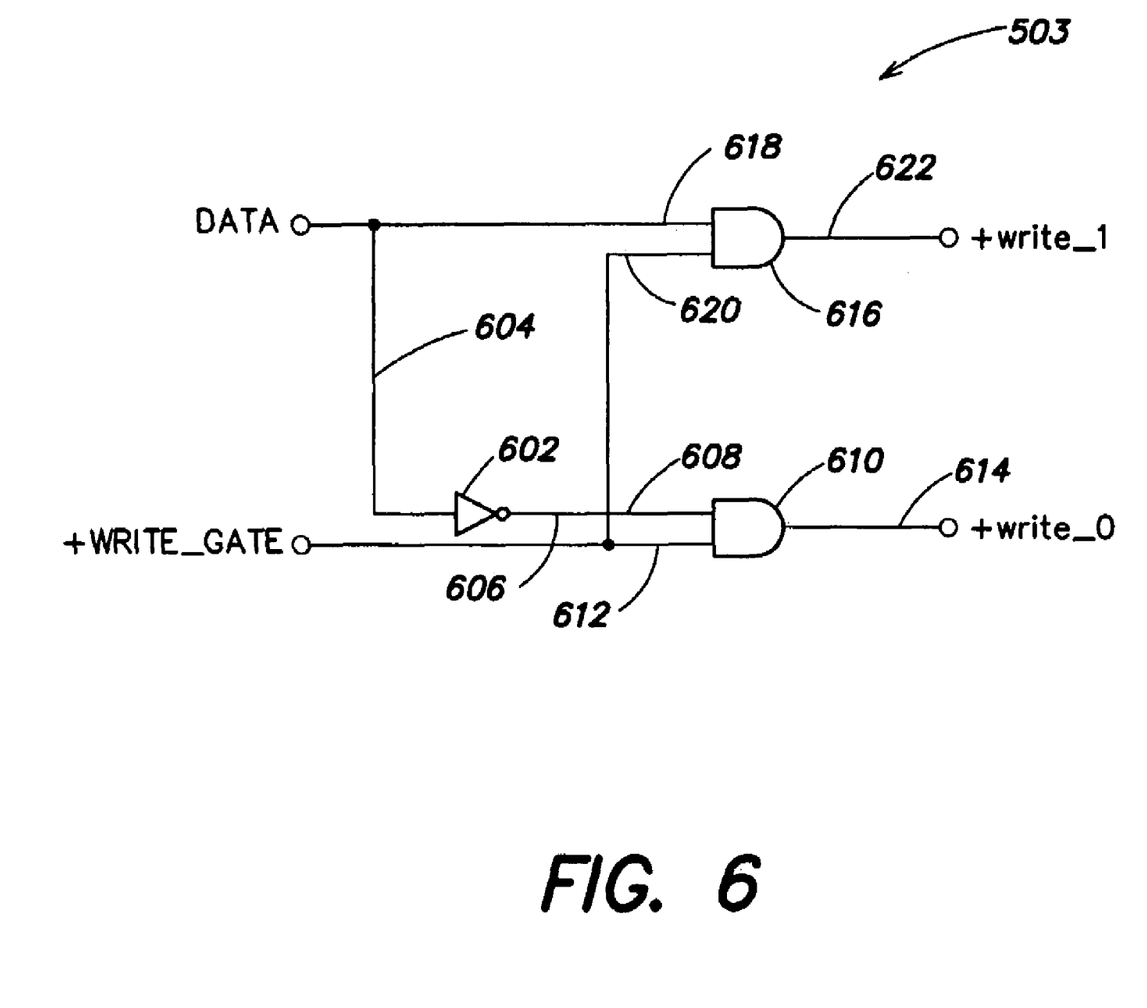
FIG. 6 is a block diagram of a gating cell included in gating logic of the first exemplary memory system in accordance with an embodiment of the present invention.

FIG. 6 is a block diagram of the gating cell 503 included in gating logic 502 of the first exemplary memory system 500 in accordance with an embodiment of the present invention. With reference to FIG. 6, the gating cell 503 of the gating logic 502 may include an inverter 602. An input 604 of the inverter 602 may be coupled to signal DATA, which may be data to be stored in a corresponding memory element 300, 400, and an output of the inverter 606 may be coupled to a first input 608 of a first AND gate 610. A second input 612 of the first AND gate 610 may be coupled to signal +WRITE_GATE. The first AND gate 610 is adapted to output signal + write_0 based on such input signals via an output 614. Further, the gating cell 503 may include a second AND gate 616, a first input 618 of which may be coupled to DATA and a second input 620 of which may be coupled to +WRITE_GATE. The second AND gate 616 is adapted to output signal + write_1 based on such input signals via an output 622. In this manner, the gating cell 503 may generate desired pass gate control signals employed by the control logic 402. The gating cell 503 described is exemplary, and therefore, a gating cell having a different configuration may be employed.

Conventional non-volatile memory cells have problems. For example, conventional non-volatile memories normally require special structures with a tunneling oxide, a floating gate for charge storage, and a control gate. In the floating gate cells, high voltages or some other optical means are necessary to perform an erase operation on the cell. Alternatively, conventional non-volatile SONOS (silicon-oxide-nitride-oxide-silicon) cells may trap charge in a nitride layer. However, SONOS cells also require relatively large programming voltages. Such cells may require elaborate charge pumping circuitry to generate the large voltages. Furthermore, dealing with these high voltages presents reliability and operability challenges for modern technologies designed to operate at very low voltage.

In contrast, the present invention may avoid problems of conventional memory cells by providing a non-volatile memory structure that includes transistors with a high-k dielectric such as HfSiO. The memory structure may perform an erase operation using a lower voltage than that required by conventional cells. More specifically, a programming voltage of the non-volatile high-k (e.g., HfSiO) dielectric memory structure may be significantly reduced compared with that of standard floating gate and SONOS non-volatile cells. Such voltage may be generated easily by contemporary low-voltage CMOS technology. The present invention memory structure may not require special processing. Additionally, the memory structure may be integrated easily into existing and future CMOS processes. In this manner, the high-k (e.g., HfSiO) dielectric memory structure may incur little or no additional process cost (e.g., beyond a cost of providing modest charge pump circuitry for generating desired programming voltages).

The memory structure (e.g., circuitry) employs a non-volatile memory effect of high-k gate dielectric MOSFETs. More specifically, the present memory structure employs a shift in device characteristics (e.g., the positive Vt shift) of such MOSFETs caused by application of a positive gate bias voltage for a time period (e.g., a short time period). The shift in Vt may be obtained without a build up in interface states and/or other forms of device degradation. Further, the original Vt may be recoverable. More specifically, an original Vt may nearly be restored by application of a negative gate bias voltage without a build up in interface states and/or other forms of device degradation. Additionally, the present non-volatile memory structure may require programming voltages (e.g., to write data into or erase data from the structure) which are easily generated by the existing devices in the contemporary CMOS technology. Further, the inventive non-volatile memory structure may be easily integrated into contemporary CMOS technologies (e.g., without requiring special structures).

The foregoing description discloses only exemplary embodiments of the invention. Modifications of the above disclosed apparatus and methods which fall within the scope of the invention will be readily apparent to those of ordinary skill in the art. For instance, although the control logic 310, 402 is coupled to and outputs programming voltages to an NMOS, in other embodiments, the control logic 310, 402 may be coupled to and output programming voltages to a PMOS. Although the MOSFETs described above include a dielectric material layer having a thickness of about 4 nm, a larger or smaller thickness may be employed.

Accordingly, while the present invention has been disclosed in connection with exemplary embodiments thereof, it should be understood that other embodiments may fall within the spirit and scope of the invention, as defined by the following claims.

The invention claimed is:

1. A method of storing data in a memory element, comprising:
    operating a memory element, having:
        a first MOSFET and a second MOSFET each including a dielectric material having a dielectric constant of about 3.9 to about 25, a first one of (a) a source, and (b) a drain of said first MOSFET and of said second MOSFET being coupled to a common reference voltage, and the second one of (a) said source, and (b) said drain of said first MOSFET being coupled to a gate of said second MOSFET; and
        control logic coupled to said MOSFETs, said control logic selectively coupling the second one of (a) said source and (b) said drain of said second MOSFET to a gate of said first MOSFET;
        wherein the control logic is adapted to:
            cause the memory element to operate in a first mode to store data, wherein when operating in said first mode said second one of (a) said source and (b) said drain of said second MOSFET is coupled to said gate of said first MOSFET; and
            cause the memory element to operate in a second mode to change a threshold voltage of said first MOSFET from an original threshold voltage to a changed threshold voltage such that the changed threshold voltage affects data stored by the memory element when operated in the first mode, wherein when operating in said second mode said second one of (a) said source and (b) said drain of said second MOSFET is de-coupled from said gate of said first MOSFET; and storing a first value in the memory element by operating the memory element in the first mode while a threshold voltage of said first MOSFET is approximately the original threshold voltage.

2. The method of claim 1 further comprising, by operating the memory element in the second mode, changing a threshold voltage of said first MOSFET from the original threshold voltage to a changed threshold voltage such that the changed threshold voltage affects data stored by the memory element when operated in the first mode while a threshold voltage of said first MOSFET is the changed threshold voltage.

3. The method of claim 2 further comprising storing a second value in the memory element by operating the memory element in the first mode while a threshold voltage of said first MOSFET is the changed threshold voltage.

4. A method of storing data, comprising:
providing a memory system having:
a plurality of the memory elements, each memory element having
a respective first MOSFET and a respective second MOSFET each including a dielectric material having a dielectric constant of about 3.9 to about 25, a first one of (a) a source, and (b) a drain of the respective first MOSFET and of the respective second MOSFET being coupled to a common reference voltage, and the second one of (a) said source, and (b) said drain of the respective first MOSFET being coupled to a gate of the respective second MOSFET; and
respective control logic coupled to said respective MOSFETs, said control logic selectively coupling the second one of (a) said source and (b) said drain of the respective second MOSFET to a gate of the respective first MOSFET, wherein the control logic is adapted to:
cause the memory element to operate in a first mode to store data, wherein when operating in said first mode said second one of (a) said source and (b) said drain of the respective second MOSFET is coupled to said gate of the respective first MOSFET; and
cause the memory element to operate in a second mode to change a threshold voltage of the respective first MOSFET from an original threshold voltage to a changed threshold voltage such that the changed threshold voltage affects data stored by the memory element when operated in the first mode, wherein when operating in said second mode said second one of (a) said source and (b) said drain of the respective second MOSFET is de-coupled from said gate of the respective first MOSFET; and gating logic coupled to the plurality of memory elements, and adapted to:
store respective data into the plurality of memory elements in parallel; and
generate signals adapted to change respective threshold voltages of the respective first MOSFETs in one or more of the plurality of memory elements; and
storing respective data into the plurality of memory elements in parallel.

5. The method of claim 4 further comprising generating signals adapted to change respective threshold voltages of the respective first MOSFETS in one or more of the plurality of memory elements.

6. The method of claim 4 further comprising reducing a current required to store respective data into the plurality of memory elements in parallel.

7. The method of claim 1 wherein the control logic includes:
a first pass-gate adapted to output, based on a first control signal, a first voltage to said gate of said first MOSFET, thereby changing the threshold voltage of said first MOSFET from said original threshold voltage to said changed threshold voltage; and
a second pass-gate adapted to selectively couple and de-couple said second one of (a) said source and (b) said drain of said second MOSFET from said gate of said first MOSFET based on a second control signal.

8. The method of claim 7 wherein the first pass-gate includes a transistor having at least one of a triple-well and a silicon-on-insulator design.

9. The method of claim 1 wherein said memory element further includes third and fourth MOSFETs, said first and second MOSFETs being n-channel MOSFETs (NFETs) and said third and fourth MOSFETs being p-channel MOSFETs, sources of said third and fourth MOSFETs being coupled to a common supply voltage and the sources of said first and second MOSFETs being coupled to a ground, a gate of the third MOSFET being coupled to a drain of the fourth MOSFET, a gate of the fourth MOSFET being coupled to a drain of the third MOSFET, a drain of the third MOSFET being coupled to the drain of the first MOSFET, and a drain of the fourth MOSFET being coupled to the drain of the second MOSFET.

10. The method of claim 9 wherein a channel width-to-length ratio of the first MOSFET is larger than a channel width-to-length ratio of the second MOSFET.

11. The method of claim 1 wherein said dielectric material of said first MOSFET and said second MOSFET is hafnium silicon oxide (HfSiO).

* * * * *